(12) United States Patent
Ishizuka

(10) Patent No.: US 10,340,877 B2
(45) Date of Patent: Jul. 2, 2019

(54) ANTENNA MATCHING CIRCUIT, ANTENNA DEVICE, AND COMMUNICATION TERMINAL APPARATUS

(71) Applicant: Murata Manufacturing Co., Ltd., Nagaokakyo-shi, Kyoto-fu (JP)

(72) Inventor: Kenichi Ishizuka, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 101 days.

(21) Appl. No.: 15/640,763

(22) Filed: Jul. 3, 2017

(65) Prior Publication Data

US 2017/0302246 A1    Oct. 19, 2017

Related U.S. Application Data

(63) Continuation of application No. PCT/JP2016/050184, filed on Jan. 6, 2016.

(30) Foreign Application Priority Data

Jan. 16, 2015 (JP) ................. 2015-006665

(51) Int. Cl.
*H01Q 1/24* (2006.01)
*H03H 7/38* (2006.01)
(Continued)

(52) U.S. Cl.
CPC .............. *H03H 7/38* (2013.01); *H01Q 1/24* (2013.01); *H03H 7/09* (2013.01); *H04B 1/04* (2013.01);
(Continued)

(58) Field of Classification Search
None
See application file for complete search history.

(56) References Cited

U.S. PATENT DOCUMENTS 8,606,198 B1    12/2013 Wright
9,106,313 B2 *   8/2015 Ueki .................. H03H 7/38
(Continued)

FOREIGN PATENT DOCUMENTS

JP    2009-171523 A    7/2009
JP    2013-168892 A    8/2013
(Continued)

OTHER PUBLICATIONS

Official Communication issued in International Patent Application No. PCT/JP2016/050184, dated Mar. 1, 2016.
(Continued)

*Primary Examiner* — Trinh V Dinh
(74) *Attorney, Agent, or Firm* — Keating & Bennett, LLP

(57) ABSTRACT

An antenna device includes an impedance converter circuit connected to a feeder circuit, an impedance-conversion-ratio adjustment circuit, and an antenna. The impedance converter circuit includes a first inductance element and a second inductance element, which are coupled to each other through magnetic fields, so as to provide an autotransformer circuit. The impedance-conversion-ratio adjustment circuit includes a third inductance element which is series-connected between the impedance converter circuit and an antenna port, and a capacitance element which is shunt-connected between the antenna port and ground. The impedance-conversion-ratio adjustment circuit corrects an impedance conversion ratio of the impedance converter circuit in accordance with a frequency band.

20 Claims, 12 Drawing Sheets

(51) Int. Cl.
*H04B 1/04* (2006.01)
*H04B 1/18* (2006.01)
*H04B 1/40* (2015.01)
*H03H 7/09* (2006.01)
*H03H 1/00* (2006.01)

(52) U.S. Cl.
CPC ............. *H04B 1/0458* (2013.01); *H04B 1/18* (2013.01); *H04B 1/40* (2013.01); *H03H 2001/0085* (2013.01)

(56) References Cited

U.S. PATENT DOCUMENTS

| | | | | |
|---|---|---|---|---|
| 9,837,976 | B2* | 12/2017 | Kato | .................... H04B 1/0458 |
| 2013/0187824 | A1* | 7/2013 | Kato | .................... H04B 1/0458 |
| | | | | 343/852 |
| 2014/0055209 | A1 | 2/2014 | Ishizuka et al. | |
| 2014/0065980 | A1* | 3/2014 | Ueki | ........................ H03H 7/38 |
| | | | | 455/73 |
| 2014/0266964 | A1* | 9/2014 | Kato | ...................... H01Q 5/335 |
| | | | | 343/860 |
| 2015/0180440 | A1* | 6/2015 | Ishizuka | ............. H01F 27/2804 |
| | | | | 333/32 |
| 2017/0133999 | A1* | 5/2017 | Ishizuka | .................. H03H 7/18 |

FOREIGN PATENT DOCUMENTS

| | | |
|---|---|---|
| WO | 2012/114983 A1 | 8/2012 |
| WO | 2012/153654 A1 | 11/2012 |
| WO | 2012/153691 A1 | 11/2012 |

OTHER PUBLICATIONS

Official Communication issued in corresponding Japanese Patent Application No. 2016-569314, dated Feb. 12, 2019.

\* cited by examiner freq.(700.0MHz to 2.200GHz)

freq.(700.0MHz to 2.200GHz)

freq.(700.0MHz to 3.000GHz)

freq.(700.0MHz to 3.000GHz)

freq.(600.0MHz to 2.700GHz)

freq.(600.0MHz to 2.700GHz)

US 10,340,877 B2

ANTENNA MATCHING CIRCUIT, ANTENNA DEVICE, AND COMMUNICATION TERMINAL APPARATUS

CROSS REFERENCE TO RELATED APPLICATIONS

This application claims the benefit of priority to Japanese Patent Application No. 2015-006665 filed on Jan. 16, 2015 and is a Continuation Application of PCT Application No. PCT/JP2016/050184 filed on Jan. 6, 2016. The entire contents of each application are hereby incorporated herein by reference.

BACKGROUND OF THE INVENTION

1. Field of the Invention

The present invention relates to an antenna matching circuit connected between an antenna and a feeder circuit, an antenna device including the antenna matching circuit, and a communication terminal apparatus including the antenna device.

2. Description of the Related Art

In recent years, to cope with the widening of a frequency band required for communication terminal apparatuses, such as cellular phones, an impedance converter circuit including a transformer has been used in an antenna matching circuit, as discussed in, for example, International Publication No. 2012/153691. Meanwhile, antennas have become smaller as communication terminal apparatuses have become smaller. In accordance with the size reduction of the antennas, the antennas' impedance tends to have greater frequency dependence (the impedance's rate of change relative to a frequency change).

One of the features of an impedance converter circuit including a transformer is that it has small frequency dependence (the impedance's rate of change relative to a frequency change). As described above, if such an impedance converter circuit is applied to an antenna whose impedance has large frequency dependence, it is difficult to achieve impedance matching over a wide band.

FIG. 11A is a diagram illustrating the frequency characteristics of a reflection coefficient of an antenna whose impedance has large frequency dependence. FIG. 11B is a diagram representing the frequency characteristics of the reflection coefficient on the Smith chart. Markers m1 and m2 respectively indicate a low-band frequency band, and markers m3 and m4 indicate a high-band frequency band. In the example illustrated in FIGS. 11A and 11B, matching is achieved in a certain band of the high band (1.7 GHz to 2.7 GHz band), but not in the low band (700 MHz to 960 MHz band).

FIG. 12A is a diagram illustrating the frequency characteristics of a reflection coefficient in a state where a conventional impedance converter circuit including a transformer is connected to the above-described antenna. FIG. 12B is a diagram representing the frequency characteristics of the reflection coefficient on the Smith chart. In this example, the impedance conversion ratio of the impedance converter circuit is defined to achieve matching in the low band (700 MHz to 960 MHz band). Therefore, matching is achieved in the low band, but, as indicated by a dotted circle in FIG. 12B, the locus of the reflection coefficient in the high band becomes a smaller circle. That is, because the impedance conversion ratio becomes too great in the high band, matching is not achieved in a portion of the high band.

In contrast, if a radio-frequency (RF) path including a capacitor is provided between two input/output ports of the transformer, the frequency characteristics of the impedance converter circuit can be determined. However, the effect of adjusting the frequency characteristics of the impedance conversion ratio is small even when the RF path is provided in a transformer whose coils have very small inductance.

FIG. 13 is a diagram illustrating an example where a bypass capacitor C1, which is the above-mentioned RF path, is connected to an impedance converter circuit 2 including a transformer. FIG. 14A is a diagram illustrating the frequency characteristics of a reflection coefficient in the case of viewing an antenna 1 side from a feeder circuit 9 of a circuit illustrated in FIG. 13. FIG. 14B is a diagram representing the frequency characteristics of the reflection coefficient on the Smith chart. As described above, even when the RF path is connected to an autotransformer defined by coils whose inductance is very small, the effect of the RF path is small.

SUMMARY OF THE INVENTION

Preferred embodiments of the present invention provide antenna matching circuits that perform impedance conversion with a certain impedance conversion ratio over a wide band and include a transformer with low-inductance coils, antenna devices that perform impedance matching over a wide band, and communication terminal apparatuses including at least one of the antenna devices.

An antenna matching circuit according to a preferred embodiment of the present invention is a matching circuit connected between a feeder circuit and an antenna, and includes an impedance converter circuit connected to the feeder circuit; and an impedance-conversion-ratio adjustment circuit connected between the impedance converter circuit and an antenna port, wherein the impedance converter circuit includes a first inductance element and a second inductance element that are coupled to each other through magnetic fields, a first end of the first inductance element is connected to the feeder circuit, a first end of the second inductance element is connected to a second end of the first inductance element, and a second end of the second inductance element is connected to ground, and the impedance-conversion-ratio adjustment circuit includes a third inductance element which is series-connected between the impedance converter circuit and the antenna port, and a capacitance element which is shunt-connected between the antenna port and ground, and the impedance-conversion-ratio adjustment circuit corrects an impedance conversion ratio of the impedance converter circuit in accordance with a frequency band.

With this configuration, the impedance conversion ratio in the high band is maintained to be relatively small, and the impedance conversion performed by the transformer operates effectively in the low band (without changing the characteristics of the antenna in the high band).

In an antenna matching circuit according to a preferred embodiment of the present invention, it is preferable that the impedance converter circuit and the impedance-conversion-ratio adjustment circuit be provided in a single multilayer body including a plurality of base material layers that are laminated. It is also preferable that the first inductance element, the second inductance element, the third inductance element, and the capacitance element be defined by conductor patterns provided on the base material layers. Accordingly, it is only necessary to mount the antenna matching circuit, which is a single component, on a printed wiring board or other structure, so as to facilitate the mounting on a communication terminal apparatus or other device.

In an antenna matching circuit according to a preferred embodiment of the present invention, it is preferable that the antenna matching circuit further includes a substrate on which a transmission line that leads to the antenna port is provided. It is also preferable that the impedance converter circuit be a chip component defined by a single multilayer body including a plurality of base material layers that are laminated, the first inductance element and the second inductance element be provided in an interior of the multilayer body, signal input/output terminals be provided on two sides, facing each other, of the multilayer body, and the impedance converter circuit, the third inductance element, and the capacitance element be provided on the substrate. Accordingly, the antenna matching circuit is able to be easily disposed in a middle portion of the linear transmission line between the feeder circuit and the antenna. The impedance converter circuit and the impedance-conversion-ratio adjustment circuit are able to be provided in a little space on the substrate.

In an antenna matching circuit according to a preferred embodiment of the present invention, the third inductance element may preferably be a portion of a signal line of the transmission line. Accordingly, the number of components to be mounted on the substrate is reduced so as to reduce the cost.

An antenna device according to a preferred embodiment of the present invention includes an antenna that transmits/receives a radio-frequency (RF) signal in a first frequency band and an RF signal in a second frequency band that is higher than the first frequency band; an impedance converter circuit connected to a feeder circuit; and an impedance-conversion-ratio adjustment circuit connected between the impedance converter circuit and the antenna, wherein the impedance converter circuit includes a first inductance element and a second inductance element that are coupled to each other through magnetic fields, a first end of the first inductance element is connected to the feeder circuit, a first end of the second inductance element is connected to a second end of the first inductance element, and a second end of the second inductance element is connected to ground, and the impedance-conversion-ratio adjustment circuit includes a third inductance element which is series-connected between the impedance converter circuit and the antenna, and a capacitance element which is shunt-connected with respect to ground between the third inductance element and the antenna, and the impedance-conversion-ratio adjustment circuit corrects an impedance conversion ratio of the impedance converter circuit for an RF signal in the second frequency band.

With this configuration, the antenna's characteristics are maintained in the high band, while the impedance conversion performed by the transformer operates effectively in the low band, so as to achieve matching in the low band.

In an antenna matching circuit according to a preferred embodiment of the present invention, preferably the first frequency band is a low band in a cellular communication system, and the second frequency band is a high band in the cellular communication system. Accordingly, preferred embodiments of the present invention are applicable to a communication terminal apparatus that uses both the high band and the low band in the cellular communication system.

In an antenna matching circuit according to a preferred embodiment of the present invention, the antenna preferably includes, for example, an open-ended radiating element. According to this configuration, because the frequency characteristics of the impedance-conversion-ratio adjustment circuit are characteristics opposite to the frequency characteristics of a general open-ended antenna (the movement direction of the impedance locus on the Smith chart in response to a frequency change is opposite), matching is able to be achieved in a wider high band.

A communication terminal apparatus according to a preferred embodiment of the present invention includes an antenna device according to a preferred embodiment of the present invention, a communication circuit connected to the antenna device, and a casing that contains the antenna device and the communication circuit. Accordingly, a communication terminal apparatus that copes with a wide band while it includes a small antenna is able to be obtained.

According to various preferred embodiments of the present invention, because the impedance conversion ratio in the high band is maintained to be relatively small, and impedance conversion performed by the transformer operates effectively in the low band, matching is able to be achieved over a wide band for an antenna with frequency-dependent impedance.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
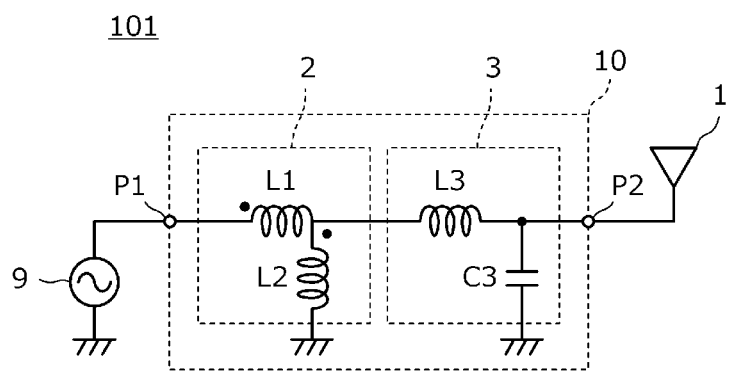
FIG. 1 is a circuit diagram illustrating the configuration of an antenna matching circuit and an antenna device according to a first preferred embodiment of the present invention.

Hereinafter, a plurality of preferred embodiments of the present invention will be described by providing specific examples with reference to the drawings. In the drawings, the same portions are given the same reference numeral. From a second preferred embodiment onward, descriptions of points that are common to those of a first preferred embodiment will be omitted, and different points will be described. In particular, the same or similar advantageous effects achieved by the same or similar configuration will not be described for each of the preferred embodiments.

First Preferred Embodiment

FIG. 1 is a circuit diagram illustrating the configuration of an antenna matching circuit and an antenna device according to a first preferred embodiment of the present invention. An antenna device 101 includes an antenna 1, a feeder circuit 9, and an antenna matching circuit 10. The antenna matching circuit 10 is connected between the antenna 1 and the feeder circuit 9.

The antenna matching circuit 10 includes an impedance converter circuit 2 and an impedance-conversion-ratio adjustment circuit 3.

The impedance converter circuit 2 includes a first inductance element L1 and a second inductance element L2, which are coupled to each other through magnetic fields. A first end of the first inductance element L1 is connected to the feeder circuit 9; a first end of the second inductance element L2 is connected to a second end of the first inductance element L1; and a second end of the second inductance element L2 is connected to ground. The first inductance element L1 and the second inductance element L2 define an autotransformer circuit.

The impedance-conversion-ratio adjustment circuit 3 includes a third inductance element L3 which is series-connected between the impedance converter circuit 2 and an antenna port P2, and a capacitance element C3 which is shunt-connected between the antenna port P2 and ground. The impedance-conversion-ratio adjustment circuit 3 corrects the impedance conversion ratio of the impedance converter circuit 2 in accordance with a frequency band. That is, the impedance-conversion-ratio adjustment circuit 3 corrects the impedance conversion ratio of the antenna matching circuit 10 from an impedance conversion ratio of the impedance converter circuit 2 to a certain conversion ratio. As will be described later, the impedance-conversion-ratio adjustment circuit 3 preferably reduces the impedance conversion ratio at frequencies higher than or equal to about 1 GHz (such that not too much impedance conversion will be performed).

Figure 2A:
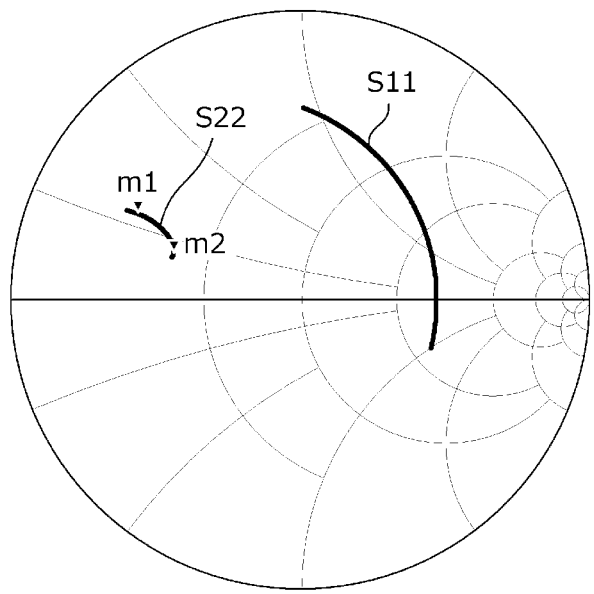
FIG. 2A is a diagram illustrating the frequency characteristics of the impedance of an impedance converter circuit 2 of the first preferred embodiment of the present invention.
Figure 2B:
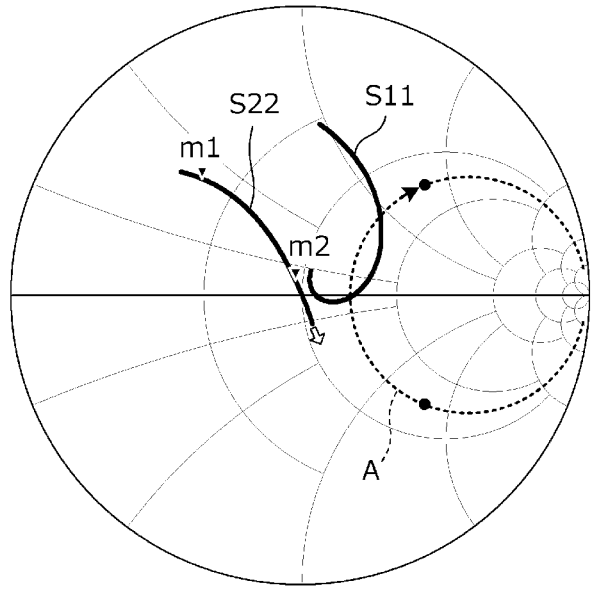
FIG. 2B is a diagram illustrating the frequency characteristics of the impedance of an antenna matching circuit 10 of the first preferred embodiment of the present invention.

FIG. 2A is a diagram illustrating the frequency characteristics of the impedance of the impedance converter circuit 2 of the present preferred embodiment. FIG. 2B is a diagram illustrating the frequency characteristics of the impedance of the antenna matching circuit 10 of the present preferred embodiment. Here, the impedance locus in the case where the frequency is changed within the range from about 700 MHz to about 2.2 GHz is represented on the Smith chart, for example.

In FIG. 2A, locus S11 is the impedance locus on a feeding port P1 side of the impedance converter circuit 2, and locus S22 is the impedance locus on the antenna side of the impedance converter circuit 2. In FIG. 2B, locus S11 is the impedance locus on the feeding port P1 side of the antenna matching circuit 10, and locus S22 is the impedance locus on the antenna port P2 side. In both figures, marker m1 indicates the impedance at about 800 MHz, and marker m2 indicates the impedance at about 1.8 GHz, for example.

Figure 5:
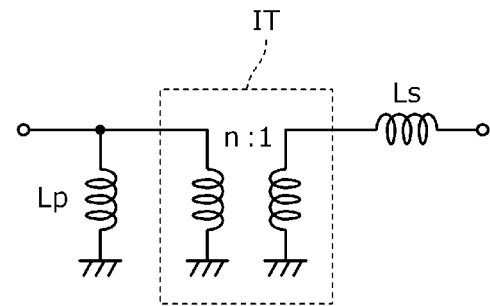
FIG. 5 is an equivalent circuit diagram of the impedance converter circuit 2 according to the first preferred embodiment of the present invention.

The equivalent circuit of the impedance converter circuit 2 is illustrated in FIG. 5. The equivalent circuit of the impedance converter circuit 2 is represented by an ideal transformer IT with a voltage transformation ratio of n:1, an inductance Lp of a parasitic component connected in parallel with the primary side, and an inductance Ls of a parasitic component connected in series with the secondary side. Here, the following relationships are maintained when the inductance of the first inductance element L1 is denoted by L1, the inductance of the second inductance element L2 is denoted by L2, and the coupling coefficient is denoted by k.

$M=k\sqrt{(L1*L2)}$ $Lp=L1+L2+2M$ $Ls=\{(1-k^2)*L1*L2\}/(L1+L2+2M)$ $n=(L1+L2+2M)/(L2+M)$ The inductance Lp operates as a parallel-connected inductor in a low frequency portion of the frequency band to be used.

As described above, because there is an inductance Lp of the parallel-connected parasitic component, as represented in FIG. 2A, the impedance on both of the feeding port side and the antenna port side of the impedance converter circuit 2 becomes inductive. Therefore, the impedance on the antenna port side is moved to the second quadrant (upper left area of the four divided areas) of the Smith chart.

Because the third inductance element L3 of the impedance-conversion-ratio adjustment circuit 3 is series-connected, the impedance is moved clockwise along a constant resistance circle on the Smith chart. Because the capacitance element C3 is shunt-connected, the impedance is moved clockwise along a constant conductance circle on the Smith chart.

The shunt-connected capacitance element C3 is more effective (impedance displacement is greater) in the high band than in the low band, and the series-connected third inductance element L3 is also more effective (impedance displacement is greater) in the high band than in the low band. From these points, as illustrated in FIG. 2B, while the impedance displacement in the low band is made smaller, the impedance in the high band is able to be moved toward the center of the Smith chart. Therefore, for the high band, the impedance conversion ratio of the impedance converter circuit 2 becomes closer to 1:1. That is, the impedance-conversion-ratio adjustment circuit 3 reduces the impedance conversion ratio of the impedance converter circuit 2.

The inductance Ls of the series parasitic component is a component connected in series with the third inductance element L3 results in contributing to the impedance adjustment in the high band along with the third inductance element L3.

In FIG. 2B, a dotted circle A is an example of the impedance locus of an open-ended antenna. The open-ended antenna is capacitive at frequencies lower than the resonant frequency and inductive at frequencies higher than the resonant frequency, and traces an impedance locus such as that indicated by the dotted line A. The frequency characteristics of the impedance-conversion-ratio adjustment circuit 3 are characteristics opposite to the frequency characteristics of this antenna (the movement direction of the impedance locus on the Smith chart in response to a frequency change is opposite). Therefore, when the antenna 1 is an open-ended antenna, the impedance conversion ratio in a wide band of the high band is maintained to be around 1:1, which means that matching is achieved over the wide band of the high band.

Examples of the open-ended antenna include a monopole antenna and an inverted F antenna. Even if the farthest point from the feeding end is structurally not open, a half-wavelength resonance antenna whose end portion is grounded also has characteristics that are equivalently the same as or similar to those of a quarter-wavelength monopole antenna.

The low band in the present preferred embodiment is an example of a "first frequency band", which is, for example, a low band in a cellular communication system. The high band in the present preferred embodiment is an example of a "second frequency band", which is, for example, a high band in the cellular communication system. As described above, preferred embodiments of the present invention are applicable to a communication terminal apparatus that uses both the high band and the low band in the cellular communication system, for example.

Figure 3A:
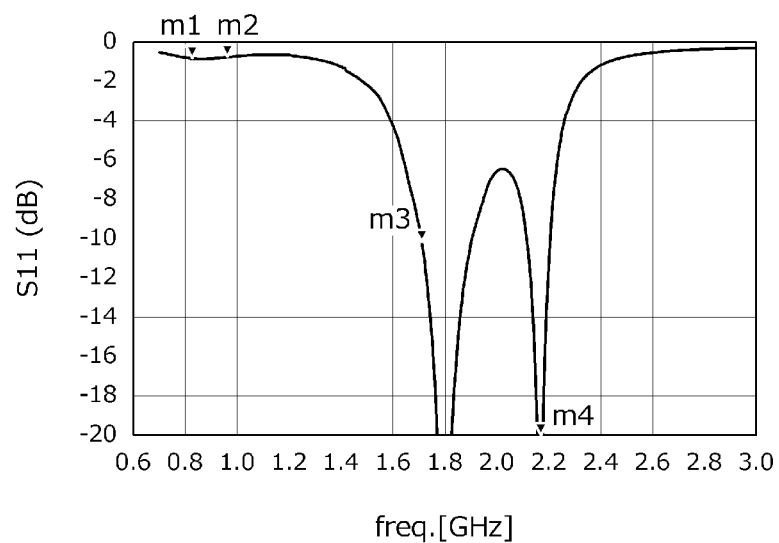
FIG. 3A is a diagram illustrating the frequency characteristics of a reflection coefficient of the antenna 1 alone.
Figure 3B:
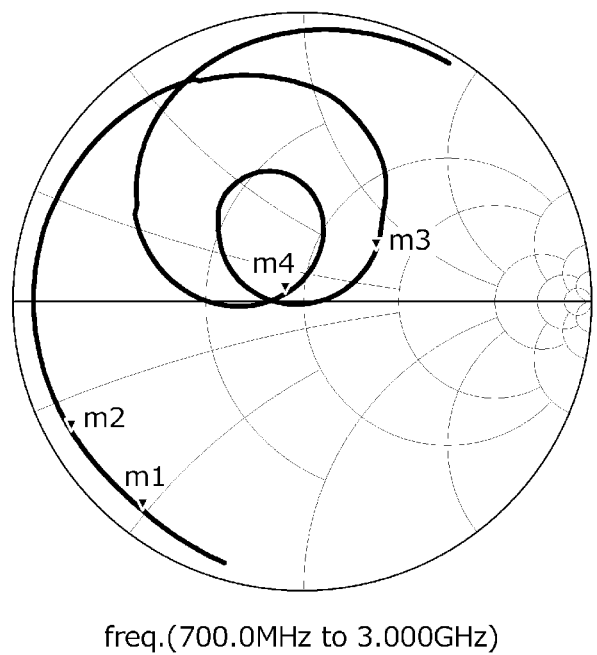
FIG. 3B is a diagram representing the frequency characteristics of the reflection coefficient on the Smith chart.
Figure 4A:
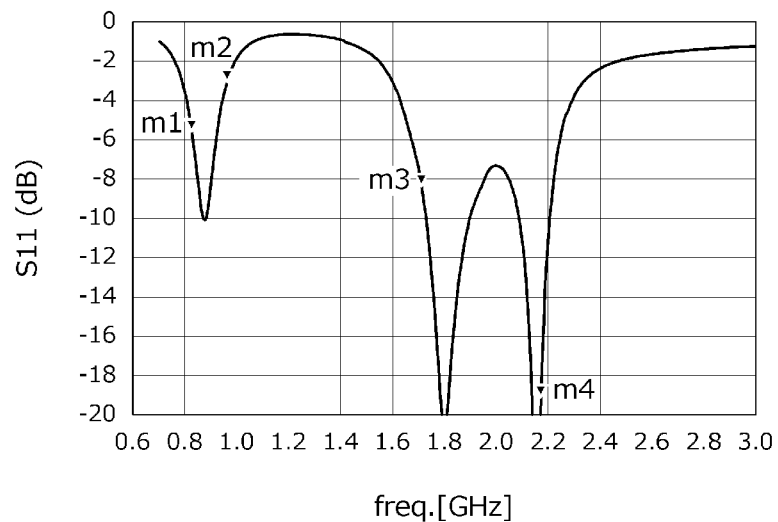
FIG. 4A is a diagram illustrating the frequency characteristics of a reflection coefficient viewed from a feeding port P1 in the case where an impedance-conversion-ratio adjustment circuit 3 is provided.
Figure 4B:
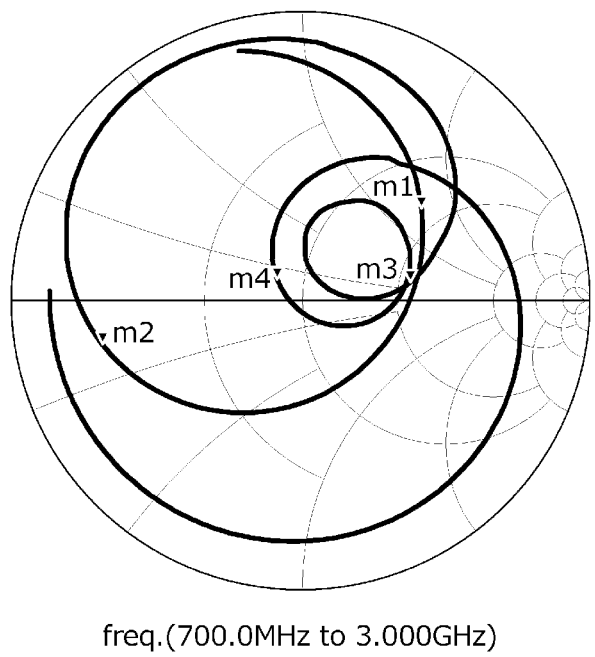
FIG. 4B is a diagram representing the frequency characteristics of the reflection coefficient on the Smith chart.

The characteristics of the antenna matching circuit 10 of the present preferred embodiment will be described with reference to FIGS. 3A to 4B. FIG. 3A is a diagram illustrating the frequency characteristics of a reflection coefficient of the antenna 1 alone. FIG. 3B is a diagram representing the frequency characteristics of the reflection coefficient on the Smith chart. FIG. 4A is a diagram illustrating the frequency characteristics of a reflection coefficient viewed from the feeding port P1 in the case where the antenna matching circuit 10 is provided. FIG. 4B is a diagram representing the frequency characteristics of the reflection coefficient on the Smith chart.

In the case where there is no antenna matching circuit 10, as illustrated in FIGS. 3A and 3B, matching is achieved in the high band indicated by markers m3 and m4, but not in the low band indicated by markers m1 and m2. If the antenna matching circuit 10 is provided in this state, the impedance viewed from the feeding port P1 is such that matching is achieved both in the high band and in the low band, as indicated by a change from FIGS. 3A and 3B to FIGS. 4A and 4B.

In this manner, when the impedance converter circuit 2 performs impedance conversion with a certain impedance conversion ratio, matching between the feeder circuit 9 and the antenna 1 is achieved in the low band. In the high band, the impedance conversion ratio is made closer to 1:1, for example, so as to achieve matching between the feeder circuit 9 and the antenna 1.

If an RF path including a capacitor is provided between two input/output ports of a transformer as in the past, an LC parallel resonance circuit is provided, and this in turn causes band-stop characteristics to occur at certain frequencies. Moreover, this causes deterioration of the Q value in the frequency band to be used. However, according to the present preferred embodiment, because no RF path is provided, no unnecessary band-stop characteristics occur, and the Q value does not deteriorate in the frequency band to be used.

Second Preferred Embodiment

A second preferred embodiment of the present invention provides an antenna matching circuit element 10P where the antenna matching circuit 10 discussed in the first preferred embodiment is a single component.

Figure 6:
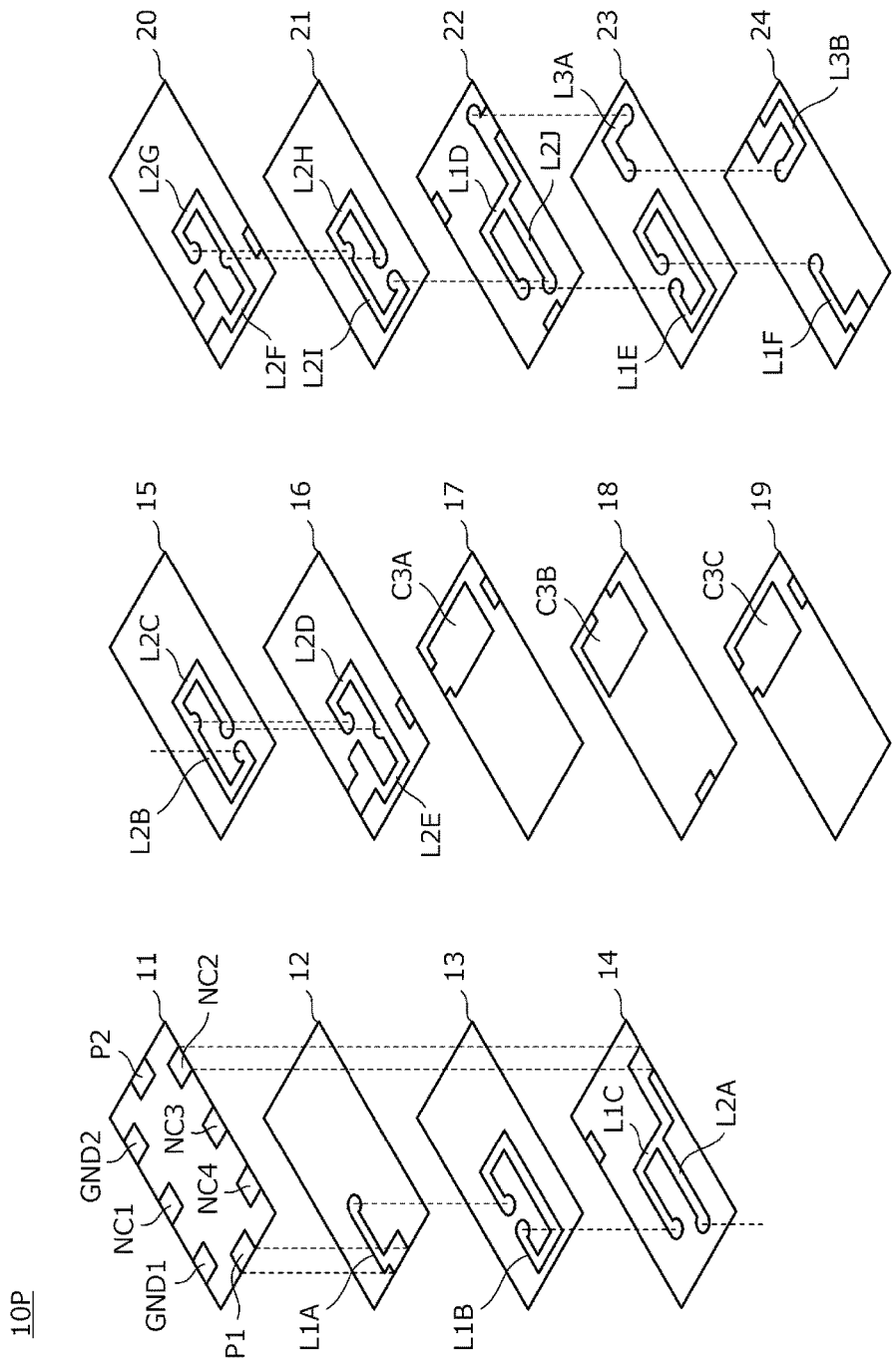
FIG. 6 is an exploded perspective view of an antenna matching circuit element 10P according to a second preferred embodiment of the present invention.

FIG. 6 is an exploded perspective view of the antenna matching circuit element 10P according to the second preferred embodiment.

The antenna matching circuit element 10P includes a plurality of insulating base material layers 11 to 24. Various conductor patterns are provided on the base material layers 11 to 24. The "various conductor patterns" preferably include not only conductor patterns provided on the surface of the base material layers, but also inter-layer connection conductors, for example. The inter-layer connection conductors preferably include not only via conductors, but also end-surface electrodes provided on the end surfaces of a multilayer body. The antenna matching circuit element 10P is preferably a multilayer body including the base material layers where the conductor patterns are provided, for example.

When the antenna matching circuit element 10P is a ceramic component, preferably, the base material layers are non-magnetic ceramic layers, and the conductor patterns are printed patterns made of a conductive material, such as a copper paste, for example. When the antenna matching circuit element 10P is a resin multilayer component, preferably, the base material layers are sheets made of a resin material, and the conductor patterns are patterned metal foils such as Al foils or Cu foils, for example.

Terminal electrodes P1, P2, GND1, GND2, NC1, NC2, NC3, and NC4 are provided on the top surface of the base material layer 11. The terminal electrode P1 corresponds to the feeding port P1, and the terminal electrode P2 corresponds to the antenna port P2. The terminal electrodes GND1 and GND2 are both ground terminals. The terminal electrodes NC1, NC2, NC3, and NC4 are all non-connect terminals (idle terminals). Note that the terminal electrode NC2 is electrically continuous with later-described conductor patterns L1C and L1D.

Conductor patterns L1A, L1B, and L1C are provided on the base material layers 12, 13, and 14, respectively. Conductor patterns L1D, L1E, and L1F are provided on the base material layers 22, 23, and 24, respectively. The conductor pattern L1A and the conductor pattern L1F are electrically continuous with the terminal electrode P1 with an end-surface electrode interposed therebetween. The conductor pattern L1C and the conductor pattern L1D are electrically continuous with each other with an end-surface electrode interposed therebetween. The first inductance element L1 is preferably defined by these conductor patterns.

Conductor patterns L2A, L2B, L2C, L2D, and L2E are provided on the base material layers 14, 15, and 16, respectively. Conductor patterns L2F, L2G, L2H, L2I, and L2J are provided on the base material layers 20, 21, and 22, respectively. The conductor pattern L2E and the conductor pattern L2F are electrically continuous with the ground terminal GND1 with an end-surface electrode interposed therebetween. The second inductance element L2 is preferably defined by these conductor patterns.

Conductor patterns C3A, C3B, and C3C are provided on the base material layers 17, 18, and 19, respectively. The capacitance element C3 is preferably defined by these conductor patterns.

Conductor patterns L3A and L3B are provided on the base material layers 23 and 24, respectively. The conductor pattern L3B is electrically continuous with the terminal electrode P2 with an end-surface electrode interposed therebetween. The third inductance element L3 is preferably defined by these conductor patterns.

Figure 7:
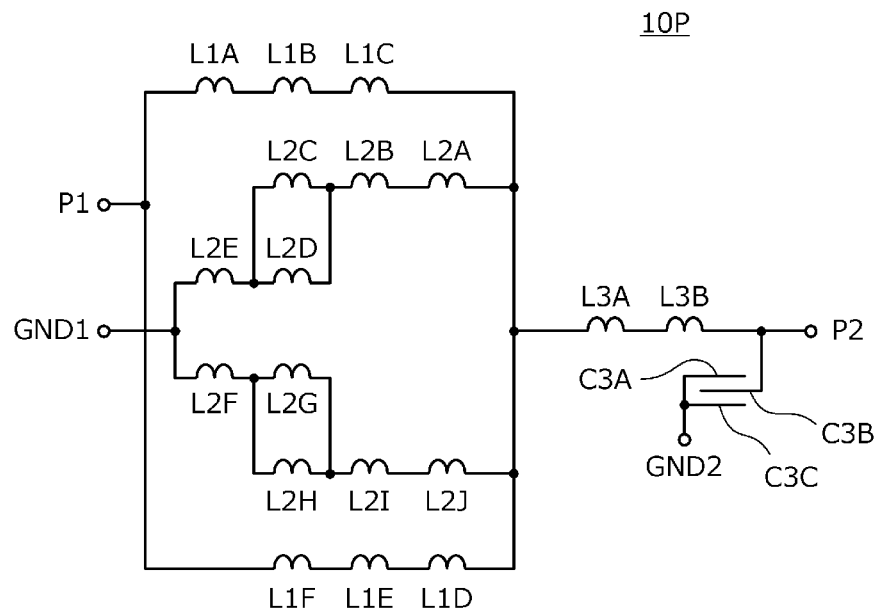
FIG. 7 is a circuit diagram of the antenna matching circuit element 10P according to the second preferred embodiment of the present invention.

FIG. 7 is a circuit diagram of the antenna matching circuit element 10P of the present preferred embodiment. In FIG. 7, the circuit diagram is illustrated by taking into consideration the positional relationship among the conductor patterns illustrated in FIG. 6. As illustrated in FIGS. 6 and 7, the second inductance element L2 defined by the conductor patterns L2A to L2J is preferably sandwiched between the conductor patterns L1A, L1B, and L1C, which define a portion of the first inductance element L1, and the conductor patterns L1D, L1E, and L1F, which define a portion of the first inductance element L1. With this structure, the first inductance element L1 and the second inductance element L2 are coupled to each other with a relatively high coupling coefficient, although the number of turns is relatively small.

The above-discussed antenna matching circuit element 10P may preferably be a rectangular or substantially rectangular parallelepiped single surface-mounted component.

Figure 8:
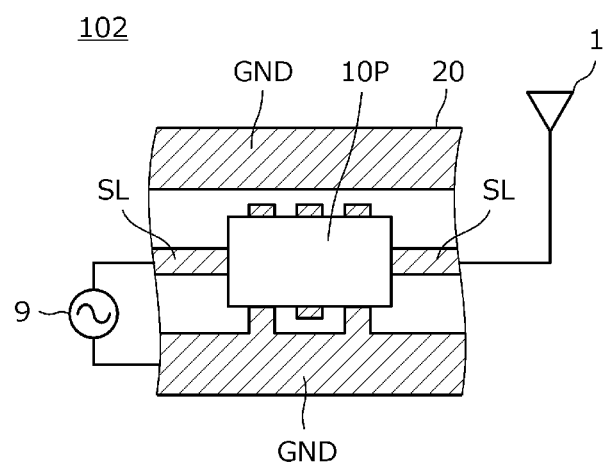
FIG. 8 is a plan view illustrating a structure where the antenna matching circuit element 10P of the second preferred embodiment is mounted on a substrate.

FIG. 8 is a plan view illustrating a structure where the antenna matching circuit element 10P of the present preferred embodiment is mounted on a substrate. A transmission line with a coplanar line structure includes ground conductors GND and a signal line SL on a substrate 20. The antenna 1 and the feeder circuit 9 are connected to the transmission line. The antenna matching circuit element 10P is mounted on the substrate 20 such that its terminal electrodes P1 and P2 are connected in series with a middle portion of the transmission line (a middle portion of the signal line SL) and its terminal electrodes GND1 and GND2 are connected to the ground conductors GND.

According to the structure in which the antenna matching circuit element 10P of the present preferred embodiment is mounted, an antenna matching circuit is able to be provided in a limited space.

Third Preferred Embodiment

Figure 9:
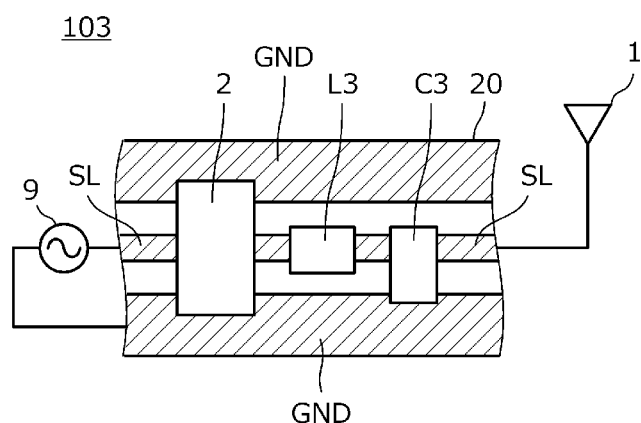
FIG. 9 is a plan view illustrating the structure of an antenna device 103 according to a third preferred embodiment of the present invention.

FIG. 9 is a plan view illustrating the structure of an antenna device 103 of a third preferred embodiment of the present invention. A transmission line with a coplanar line structure includes ground conductors GND and a signal line SL on a substrate 20. The antenna 1 and the feeder circuit 9 are connected to the transmission line. The circuit configuration of the antenna device 103 is preferably the same as or similar to the antenna device 101 discussed in the first preferred embodiment.

The impedance converter circuit 2 is preferably a surface-mountable chip component. The third inductance element L3 and the capacitance element C3 are both chip components. The antenna device 103 is configured by mounting the impedance converter circuit 2, the third inductance element L3, and the capacitance element C3 on the substrate 20.

The impedance converter circuit 2 is preferably provided in a single rectangular or substantially rectangular parallelepiped multilayer body including a plurality of base material layers that are laminated, and the first inductance element L1 and the second inductance element L2 (see FIG. 1) are defined by conductor patterns provided on the base material layers. Two signal input/output terminals of the impedance converter circuit 2 are provided on two sides, facing each other, of the multilayer body. A ground terminal is provided on at least one of the remaining two sides of the multilayer body. With such an arrangement of the terminals, as illustrated in FIG. 9, the impedance converter circuit 2 is able to be easily disposed in a middle portion of the linear transmission line (a middle portion of the signal line SL) between the feeder circuit 9 and the antenna 1. The impedance-conversion-ratio adjustment circuit 3, which includes the third inductance element L3 and the capacitance element C3, is also able to be provided in a little space on the substrate 20.

Note that the first inductance element L1 may preferably be a portion of the signal transmission line SL. For example, the line width of the signal line SL may be partially made slimmer, and that portion may operate as an inductor. In doing so, the number of components to be mounted on the substrate is reduced, so as to reduce the cost.

Fourth Preferred Embodiment

Figure 10:
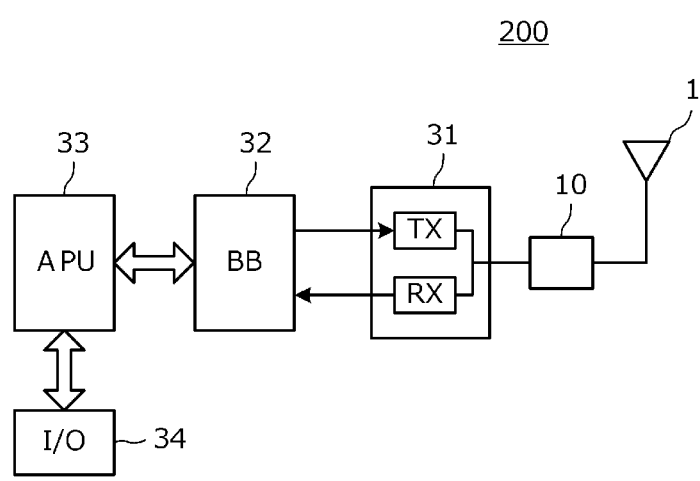
FIG. 10 is a block diagram of a communication terminal apparatus 200 according to a fourth preferred embodiment of the present invention.
Figure 11A:
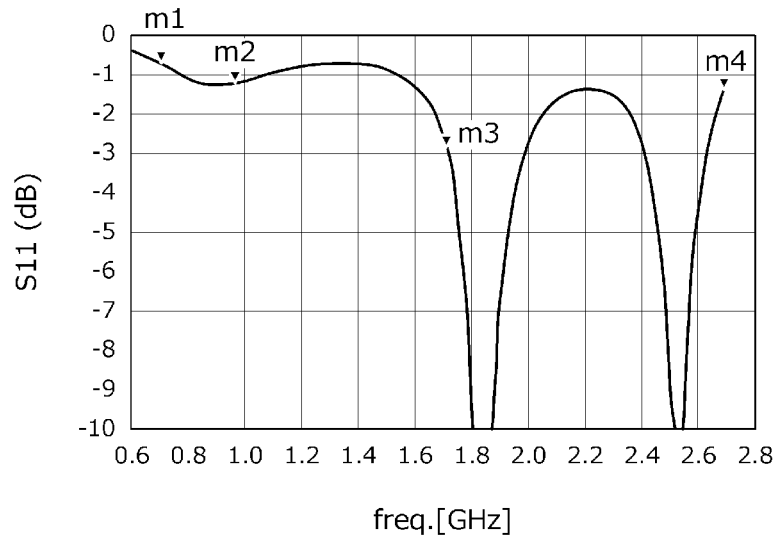
FIG. 11A is a diagram illustrating the frequency characteristics of a reflection coefficient of an antenna whose impedance has great frequency dependence.
Figure 11B:
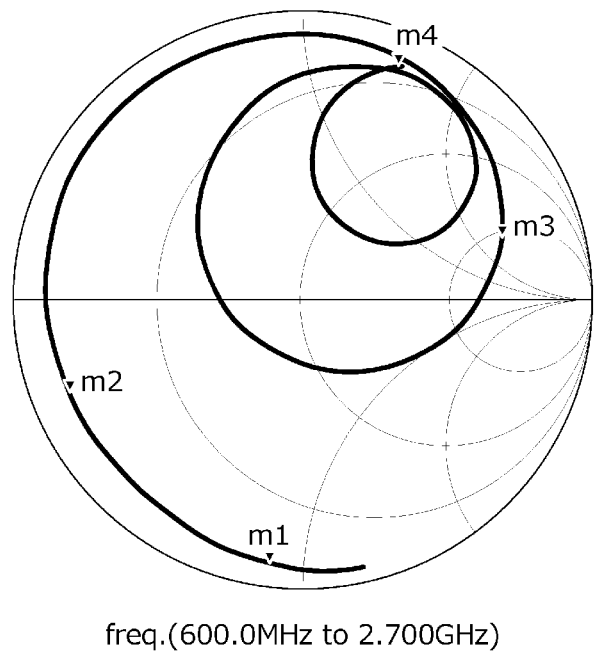
FIG. 11B is a diagram representing the frequency characteristics of the reflection coefficient on the Smith chart.
Figure 12A:
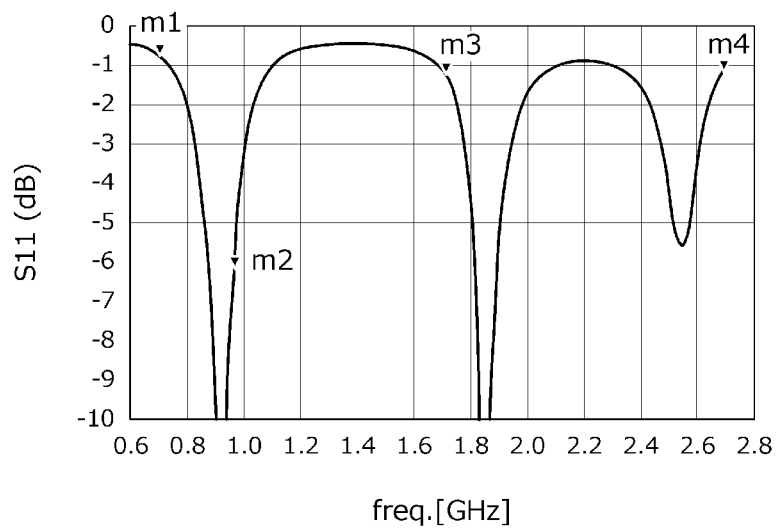
FIG. 12A is a diagram illustrating the frequency characteristics of a reflection coefficient in a state where a conventional impedance converter circuit including a transformer is connected to an antenna.
Figure 12B:
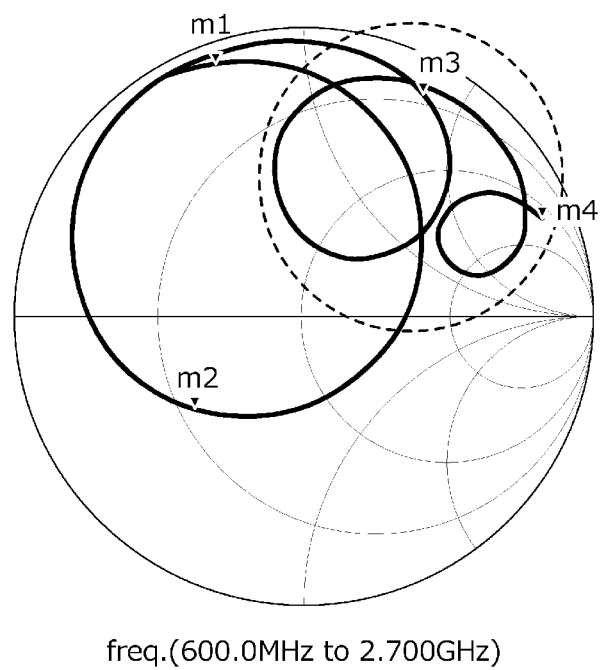
FIG. 12B is a diagram representing the frequency characteristics of the reflection coefficient on the Smith chart.
Figure 13:
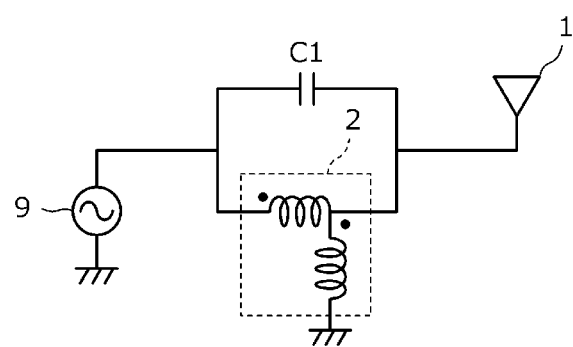
FIG. 13 is a diagram illustrating an example where a capacitor C1, which is an RF path, is connected to the impedance converter circuit 2 with the use of a transformer.
Figure 14A:
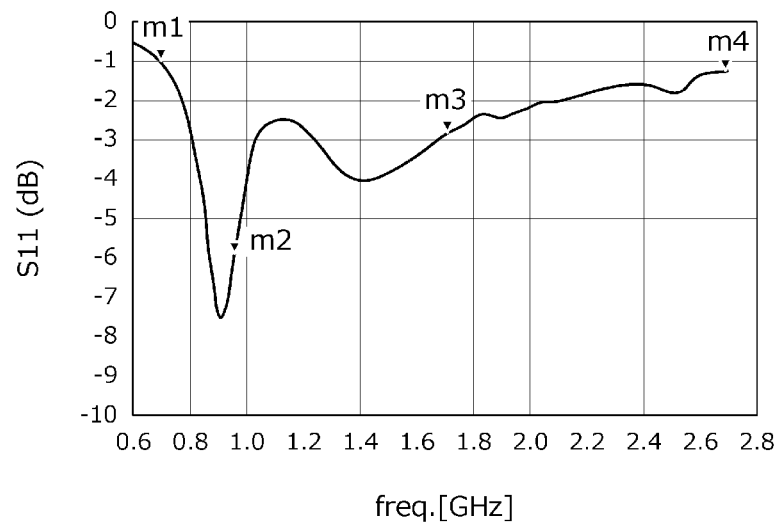
FIG. 14A is a diagram illustrating the frequency characteristics of a reflection coefficient in the case of viewing the antenna 1 side from a feeder circuit 9 of a circuit illustrated in FIG. 13.
Figure 14B:
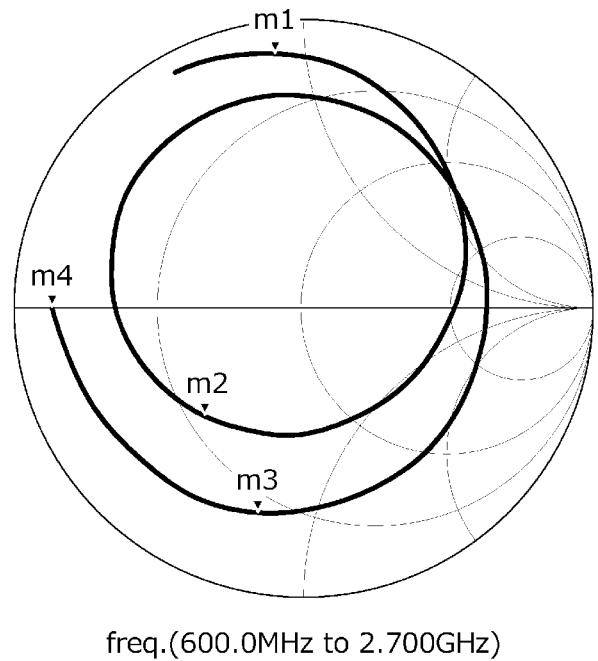
FIG. 14B is a diagram representing the frequency characteristics of the reflection coefficient on the Smith chart.

A fourth preferred embodiment of the present invention is directed to a communication terminal apparatus. FIG. 10 is a block diagram of a communication terminal apparatus 200 according to the fourth preferred embodiment. The communication terminal apparatus 200 of the present preferred embodiment includes the antenna 1, the antenna matching circuit 10, a communication circuit 31, a base-band circuit 32, an application processor 33, and an input/output circuit 34. The communication circuit 31 includes a transmission circuit and a reception circuit for each of the low band, for example, 700 MHz to 1.0 GHz, for example, and the high band, for example, 1.4 GHz to 2.7 GHz, for example, and further includes an antenna duplexer. The antenna 1 is an antenna that handles the low band and the high band. The antenna 1 is preferably an antenna whose impedance becomes capacitive at frequencies lower than the resonant frequency and becomes inductive at frequencies higher than the resonant frequency, such as a monopole antenna or an inverted F antenna, for example.

The above-described elements are preferably contained in one casing. For example, the antenna matching circuit 10, the communication circuit 31, the base-band circuit 32, and the application processor 33 are preferably mounted on a printed wiring board, and the printed wiring board is contained in the casing. The input/output circuit 34 is preferably incorporated as a display-touchscreen on the casing, for example. The antenna 1 is either mounted on the printed wiring board or disposed on an inner surface or in the interior of the casing.

With the above-discussed configuration, a communication terminal apparatus with an antenna that is able to achieve matching over a wide band is obtained.

Finally, the descriptions of the above-described preferred embodiments are only exemplary in all respects and are not construed to be limiting. Modifications and changes may be appropriately made by those skilled in the art. For example, a partial replacement or combination of configurations discussed in different preferred embodiments is possible. The scope of the present invention is defined not by the above-described preferred embodiments, but by the appended claims. In addition, it is intended that equivalents to the scope of the claims and all changes that are within the scope of the claims be included within the scope of the present invention.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An antenna matching circuit comprising:
an impedance converter circuit connected to a feeder circuit; and
an impedance-conversion-ratio adjustment circuit connected between the impedance converter circuit and an antenna port; wherein
the impedance converter circuit includes a first inductance element and a second inductance element that are coupled to each other through magnetic fields, a first end of the first inductance element is connected to the feeder circuit, a first end of the second inductance element is connected to a second end of the first inductance element, and a second end of the second inductance element is connected to ground;
the impedance-conversion-ratio adjustment circuit includes a third inductance element that is series-connected between the impedance converter circuit and the antenna port, and a capacitance element that is shunt-connected between the antenna port and ground, and the impedance-conversion-ratio adjustment circuit corrects an impedance conversion ratio of the impedance converter circuit in accordance with a frequency band; and
a first end of the third inductance element is directly connected to the impedance converter circuit, and a second end of the third inductance element is directly connected to the antenna port.

2. The antenna matching circuit according to claim 1, wherein
the impedance converter circuit and the impedance-conversion-ratio adjustment circuit are provided in a single multilayer body including a plurality of base material layers that are laminated; and
the first inductance element, the second inductance element, the third inductance element, and the capacitance element are defined by conductor patterns provided on the base material layers.

3. The antenna matching circuit according to claim 2, wherein
the antenna matching circuit is a ceramic component;
the base material layers are non-magnetic ceramic layers; and
the conductor patterns are printed patterns made of a conductive material.

4. The antenna matching circuit according to claim 3, wherein the conductive material is copper paste.

5. The antenna matching circuit according to claim 2, wherein
the antenna matching circuit is a resin multilayer component;
the base material layers are sheets made of a resin material; and
the conductor patterns are patterned metal foils.

6. The antenna matching circuit according to claim 5, wherein the patterned metal foils are aluminum foils or copper foils.

7. The antenna matching circuit according to claim 1, further comprising:
a substrate on which a transmission line that leads to the antenna port is provided, wherein
the impedance converter circuit is a chip component defined by a single multilayer body including a plurality of base material layers that are laminated, the first inductance element and the second inductance element are provided in an interior of the multilayer body, and signal input/output terminals are provided on two sides, facing each other, of the multilayer body; and
the impedance converter circuit, the third inductance element, and the capacitance element are provided on the substrate.

8. The antenna matching circuit according to claim 7, wherein the third inductance element includes a portion of a signal line of the transmission line.

9. The antenna matching circuit according to claim 1, wherein the second end of the third inductance element is connected to the capacitance element which is shunt-connected between the antenna port and ground.

10. An antenna device comprising:
an antenna that transmits/receives a radio-frequency (RF) signal in a first frequency band and an RF signal in a second frequency band that is higher than the first frequency band;
an impedance converter circuit connected to a feeder circuit; and
an impedance-conversion-ratio adjustment circuit connected between the impedance converter circuit and the antenna; wherein
the impedance converter circuit includes a first inductance element and a second inductance element that are coupled to each other through magnetic fields, a first end of the first inductance element is connected to the feeder circuit, a first end of the second inductance element is connected to a second end of the first inductance element, and a second end of the second inductance element is connected to ground;
the impedance-conversion-ratio adjustment circuit includes a third inductance element which is series-connected between the impedance converter circuit and the antenna, and a capacitance element which is shunt-connected with respect to ground between the third inductance element and the antenna, and the impedance-conversion-ratio adjustment circuit corrects an impedance conversion ratio of the impedance converter circuit for an RF signal in the second frequency band; and
a first end of the third inductance element is directly connected to the impedance converter circuit, and a second end of the third inductance element is directly connected to the antenna port.

11. The antenna device according to claim 10, wherein the first frequency band is a low band in a cellular communication system, and the second frequency band is a high band in the cellular communication system.

12. The antenna device according to claim 10, wherein the antenna includes an open-ended radiating element.

13. The antenna device according to claim 12, wherein the antenna is one of a monopole antenna and an inverted F antenna.

14. The antenna device according to claim 10, wherein
the impedance converter circuit and the impedance-conversion-ratio adjustment circuit are provided in a single multilayer body including a plurality of base material layers that are laminated; and
the first inductance element, the second inductance element, the third inductance element, and the capacitance element are defined by conductor patterns provided on the base material layers.

15. The antenna device according to claim 14, wherein
the antenna device is a ceramic component;
the base material layers are non-magnetic ceramic layers; and
the conductor patterns are printed patterns made of a conductive material.

16. The antenna device according to claim 14, wherein
the antenna device is a resin multilayer component;
the base material layers are sheets made of a resin material; and
the conductor patterns are patterned metal foils.

17. The antenna device according to claim 10, further comprising:
a substrate on which a transmission line that leads to the antenna port is provided; wherein
the impedance converter circuit is a chip component defined by a single multilayer body including a plurality of base material layers that are laminated, the first inductance element and the second inductance element are provided in an interior of the multilayer body, and signal input/output terminals are provided on two sides, facing each other, of the multilayer body; and
the impedance converter circuit, the third inductance element, and the capacitance element are provided on the substrate.

18. The antenna device according to claim 17, wherein the third inductance element includes a portion of a signal line of the transmission line.

19. The antenna device according to claim 10, wherein the second end of the third inductance element is connected to the capacitance element which is shunt-connected between the antenna port and ground.

20. A communication terminal apparatus comprising:
an antenna device according to claim 10;
a communication circuit connected to the antenna device; and
a casing that contains the antenna device and the communication circuit.

* * * * *